(12) United States Patent
Admasu et al.

(10) Patent No.: US 6,824,880 B1
(45) Date of Patent: Nov. 30, 2004

(54) PROCESS FOR IMPROVING ADHESION OF RESISTIVE FOIL TO LAMINATING MATERIALS

(75) Inventors: Atnaf Admasu, Richmond Heights, OH (US); Jiangtao Wang, Cleveland Heights, OH (US); Sidney Clouser, Chardon, OH (US)

(73) Assignee: Ga-Tek, Inc., Eastlake, OH (US)

( * ) Notice: Subject to any disclaimer, the term of this patent is extended or adjusted under 35 U.S.C. 154(b) by 0 days.

(21) Appl. No.: 10/439,124

(22) Filed: May 15, 2003

(51) Int. Cl.$^7$ .............................................. B32B 15/04
(52) U.S. Cl. .................... 428/447; 428/448; 428/450; 428/901; 428/343
(58) Field of Search ................ 428/446, 447, 428/448, 450, 901, 343

(56) References Cited

U.S. PATENT DOCUMENTS

| | | | |
|---|---|---|---|
| 5,039,570 A | 8/1991 | Sturm | 428/209 |
| 5,061,550 A | * 10/1991 | Shimizu et al. | 428/209 |
| 5,243,320 A | 9/1993 | Clouser et al. | 338/308 |
| 5,709,957 A | 1/1998 | Chiang et al. | 428/615 |
| 6,117,536 A | 9/2000 | Poutasse | 428/301.1 |
| 6,132,589 A | * 10/2000 | Ameen et al. | 205/177 |
| 6,248,401 B1 | 6/2001 | Chiang et al. | 427/255.7 |
| 6,266,193 B1 | 7/2001 | Saif et al. | 359/582 |
| 6,329,899 B1 | 12/2001 | Hunt et al. | 338/308 |
| 6,489,034 B1 | 12/2002 | Wang et al. | 428/469 |
| 6,489,035 B1 | 12/2002 | Wang et al. | 428/469 |

FOREIGN PATENT DOCUMENTS

| | | |
|---|---|---|
| EP | 1 123 988 A1 | 8/2001 |
| EP | 1 178 128 A1 | 2/2002 |

OTHER PUBLICATIONS

Wang et al.; "Thin Film Resistors"; Proceedings of the IPC Printed Circuits EXPO 2001; pp. 1–6.

* cited by examiner

*Primary Examiner*—Randy Gulakowski
*Assistant Examiner*—Michael J. Feely
(74) *Attorney, Agent, or Firm*—Renner, Otto, Boisselle & Sklar, LLP

(57) ABSTRACT

The invention relates to a process to enhance adhesion of resistive foil to laminating materials, including: providing a copper foil; depositing at least one resistive metal layer on at least one side of the copper foil; and applying at least one layer of at least one adhesion-promoting material over and adhered to the resistive metal layer, the adhesion-promoting material being suitable for enhancing adhesion between the resistive metal layer and laminating materials. The resistive metal layer may include NiCr, NiCrAlSi, aluminum, nickel, zinc, titanium, vanadium, chromium, manganese, iron, tantalum, molybdenum, ruthenium, and alloys, oxides, nitrides and silicides thereof. The invention further relates to a multilayer foil and to a laminate, both including the resistive metal layer and adhesion-promoting material.

40 Claims, 1 Drawing Sheet

PROCESS FOR IMPROVING ADHESION OF RESISTIVE FOIL TO LAMINATING MATERIALS

FIELD OF THE INVENTION

The present invention relates to resistive metal foils, and more particularly, to metal foils such as copper foils which are used in the production of a variety of products including printed circuit boards, and which include resistive metals embedded in the boards. More particularly, the invention relates to improving adhesion between the resistive metal of resistive metal foils and insulating laminating materials such as prepregs.

BACKGROUND OF THE INVENTION

Printed circuit boards are currently used as the substrate materials in a wide variety of electronic devices. Typically, these boards are fabricated from a thin sheet of copper foil laminated to either a fiberglass/epoxy hard board or, in some instances, flexible plastic substrates. During the latter stages of the fabrication, the copper foil is printed with the necessary circuit pattern, and the unnecessary portions of the copper foil are then etched away to provide the desired interconnecting circuitry between various components in the electronic circuit design.

Resistive metal foils are metal foils including one or more resistive areas, in which a resistor is formed as an integral part of the metal foil. Embedding resistors in a printed circuit or wiring board both reduces the size of the package and improves reliability and electrical performance. Integrating resistors into the printed circuit board laminate substrate frees up the surface area of the board which would otherwise be taken by the resistor, enabling increased device functionality by placement of a greater number of active components on the surface of the laminate. Resistive foils may be made by vacuum deposition of a thin film resistive material, such as a resistive nickel-chromium alloy onto a conductive metal foil, such as a copper or copper-alloy based foil, through a roll-to-roll process. To enhance uniform resistivity of the resistive foil, the thin film resistive material layer may be directly deposited on the matte or shiny side of the conductive metal foil. In many applications, mechanical adhesion improving treatment, such as nodular or dendritic metal deposition, is not used prior to deposition of the resistive material layer on the conductive metal foil. Subsequent to the application of the resistive material layer, the resistive foil may be applied to an insulating laminating material, such as a prepreg, to form a laminate containing the resistive foil. In some applications, when the resistive material contains a material known as an adhesion promoting material, such as chromium, the peel strength of the resistive foil to the insulating laminating material is adequate without the addition of a further adhesion-promoting material.

The operational speed and signal integrity of an electronic device is influenced by the dielectric material which encapsulates the conductive copper line in a printed circuit board laminate. Laminate materials are changing to enable higher speed and better signal integrity by reducing dielectric constant and loss tangent by removing from the resin matrix hydroxyl and other polar groups responsible for signal degradation. The polar groups contribute to good bond strength between copper and resin. The absence of the polar groups at the copper/resin interface leads to low adhesion. However, in some applications, the peel strength is inadequate to maintain adhesion between the resistive metal layer and the insulating laminating material used in the laminate. Accordingly, what is needed is an adhesion promoting material for use in such applications.

SUMMARY OF THE INVENTION

This invention relates to a process to enhance adhesion of resistive foil to laminating materials, including providing a metal foil; depositing at least one resistive metal layer on a side of the metal foil; applying at least one layer of at least one adhesion-promoting material over and adhered to the resistive metal layer; and laminating the resistive metal layer to a laminating material, the adhesion-promoting material providing enhanced adhesion between the resistive metal layer and the laminating material having a peel strength of at least 2.5 lb/in. The invention further relates to a metal body including a metal foil layer; a resistive metal layer overlying and adhered to the metal foil layer; and an adhesion-promoting material layer overlying and adhered to the resistive metal layer, the adhesion-promoting material providing enhanced adhesion between the resistive metal layer and a laminating material having a peel strength of at least 2.5 lb/in. The invention further relates to laminates including a metal foil layer; a resistive metal layer overlying and adhered to the metal foil layer, an adhesion-promoting material layer overlying and adhered to the resistive metal layer; and a layer of an electrically non-conductive material overlying and adhered to the adhesion-promoting layer, the adhesion-promoting material providing enhanced adhesion between the resistive metal layer and the laminating material having a peel strength of at least 2.5 lb/in. In one embodiment, the resistive metal layer comprises NiCr, NiCrAlSi, aluminum, nickel, zinc, titanium, vanadium, chromium, manganese, iron, tantalum, molybdenum, ruthenium, and alloys, oxides, nitrides and silicides thereof.

Thus, the present invention relates to a metal foil having a resistive metal layer and improved adhesion between the resistive metal layer and laminating materials which may be applied thereto. The present invention provides a solution to the problem of poor adhesion between resistive metals and certain laminating materials used in making, e.g., PCBs.

Figure 1:
FIG. 1 is a schematic diagram representing a cross-sectional view of a metal foil of the present invention including a resistive metal layer and an adhesion-promoting material layer.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing embedded circuits. The present invention can be practiced in conjunction with printed circuit board fabrication techniques currently used in the art, and only so much of the commonly practiced process steps are included as are necessary for an understanding of the present invention.

DETAILED DESCRIPTION

Definitions

As used herein, the term "overlies" and cognate terms such as "overlying" and the like, when referring to the relationship of one or a first layer relative to another or a second layer, refers to the fact that the first layer partially or completely overlies the second layer. The first layer overlying the second layer may or may not be in contact with the second layer. For example, one or more additional layers may be positioned between the first and the second layer. The term "underlies" and cognate terms such as "underlying" and the like have similar meanings except that the first layer partially or completely lies under, rather than over, the second layer.

The terms "untreated" and "raw" are used herein to refer to a base foil as prepared which has not been subjected to subsequent treatment, (e.g., one or more surface roughening treatments) for the purpose of refining or enhancing the foil properties. The raw foil is also referred to as "as plated" or "as rolled." The term "treated" as used herein is used herein to refer to raw or base foil that has been subjected to at least one such treatment. These treatments are conventional and typically involve the use of various treating and rinsing solutions. Either or both sides of the foil can be treated. The treatments may be chemical or physical treatments.

In accordance with the present invention, an adhesion-promoting layer is applied to a resistive metal layer on a metal foil. When the metal foil with the resistive metal layer and the adhesion-promoting layer is laminated to a laminating material, for example, to form a PCB, the adhesion-promoting material increases the peel strength of the laminate-resistive metal layer bond to a peel strength of about 2.5 lb/in or greater. A peel strength of at least about 2.2 lb/in, or about 3 lb/in, is needed to insure adequate bonding between a resistive metal layer and a laminate which is applied to the resistive metal layer in fabrication of, e.g., a PCB. In one embodiment, in the absence of the adhesion-promoting material, the peel strength is substantially less than 2.9 lb/in. In some embodiments, in the absence of the adhesion-promoting material, the peel strength is less than 2.5 lb/in, and in some embodiments, in the absence of the adhesion-promoting material, the peel strength is substantially less than 2.0 lb/in, and in some embodiments, in the absence of the adhesion-promoting material, the peel strength is about 1.1 lb/in, in another about 0.1 lb/in, and in another, substantially zero. Thus, the adhesion-promoting material provides a significant increase in peel strength, as is particularly helpful in certain combinations of resistive metal layer material and laminating material.

In one embodiment, when the adhesion-promoting material is applied to the resistive metal layer, and the resistive foil formed thereby is laminated to a laminating material, the observed peel strength of the resistive metal foil bond to the laminating material is increased by about 1 lb/in to about 4.5 lb/in over the peel strength obtained without use of the adhesion-promoting material. Thus, for example, in certain combinations of resistive metal layer material and laminating material, the initial peel strength is substantially zero, and use of the adhesion-promoting material increases the peel strength to about 2.9 lb/in or greater. In another embodiment, in a combination of resistive metal layer material and laminating material, the initial peel strength is substantially zero, and use of the adhesion-promoting material increases the peel strength to about 3.7 lb/in or greater. In another embodiment, in a combination of resistive metal layer material and laminating material, the initial peel strength is about 1.1 lb/in, and use of the adhesion-promoting material increases the peel strength to about 3 lb/in or greater, and in another embodiment, to about 5.5 lb/in or greater. In another embodiment, in a combination of resistive metal layer material and laminating material, the initial peel strength is about 1.5 lb/in, and use of the adhesion-promoting material increases the peel strength to about 2.9 lb/in, in another embodiment to about 3.6 lb/in or greater, and in yet another embodiment, to about 4.3 lb/in or greater. In another embodiment, in a combination of resistive metal layer material and laminating material, the initial peel strength is about 1.4 lb/in, and use of the adhesion-promoting material increases the peel strength to about 3.5 lb/in, and in another embodiment to about 4.4 lb/in or greater. In yet another embodiment, in a combination of resistive metal layer material and laminating material, the initial peel strength is about 0.11 lb/in, and use of the adhesion-promoting material increases the peel strength to about 2.5 lb/in. Thus, a significant increase in peel strength between the resistive metal layer and a laminating material to which the resistive metal layer is laminated can be achieved in accordance with the present invention.

FIG. 1 illustrates a multilayer foil 10 in accordance with one embodiment of the present invention, which comprises a metal foil 11, a resistive metal layer 13 overlaying the metal foil 11, and an adhesion-promoting material layer 14 overlaying the resistive metal layer 13.

Figure 2:
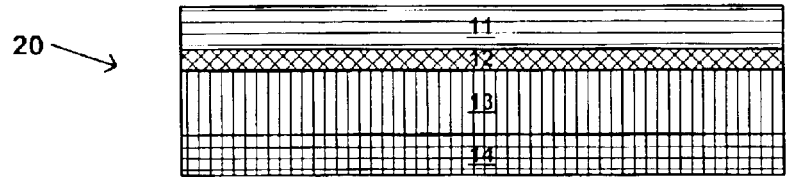
FIG. 2 is a schematic diagram representing a cross-sectional view of a metal foil of the present invention including a stabilization layer, a resistive metal layer and an adhesion promoting material layer.

FIG. 2 illustrates a multilayer foil 20 in accordance with another embodiment of the present invention which comprises a metal foil 11, a stabilization layer 12 overlaying the metal foil, a resistive metal layer 13 overlaying the stabilization layer 12, and an adhesion-promoting layer 14 overlaying the resistive metal layer 13.

Figure 3:
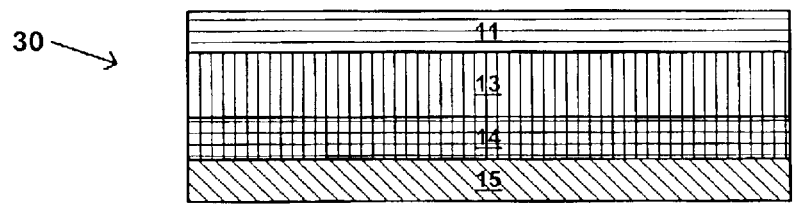
FIG. 3 is a schematic diagram representing a cross-sectional view of a laminate of the present invention, including a metal foil, a resistive metal layer, an adhesion-promoting material layer and a laminating material layer.

FIG. 3 illustrates a laminate 30 in accordance with the present invention which comprises a metal foil 11, a resistive metal layer 13 overlaying the metal foil 11, and an adhesion-promoting layer 14 overlaying the resistive metal layer 13, with the adhesion-promoting layer 14 adhered to a laminating material layer 15, for example, a cured prepreg layer.

Figure 4:
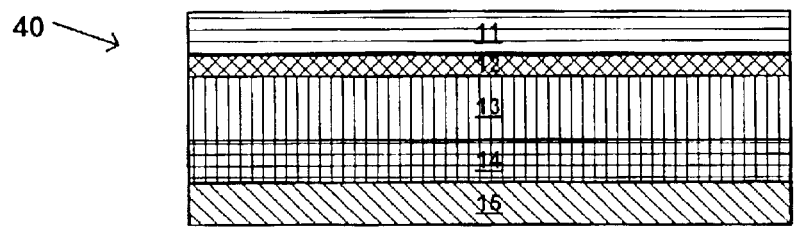
FIG. 4 is a schematic diagram representing a cross-sectional view of a laminate of the present invention, including a metal foil, a stabilization layer, a resistive metal layer, an adhesion-promoting material layer, and a laminating material layer.

FIG. 4 illustrates a laminate 40 in accordance with the present invention which comprises a metal foil 11, a stabilization layer 12 overlaying the metal foil, a resistive metal layer 13 overlaying the stabilization layer 12, and an adhesion-promoting layer 14 overlaying the resistive metal layer 13, with the adhesion-promoting layer 14 adhered to a laminating material layer 15, for example, a cured prepreg layer.

Figure 5:
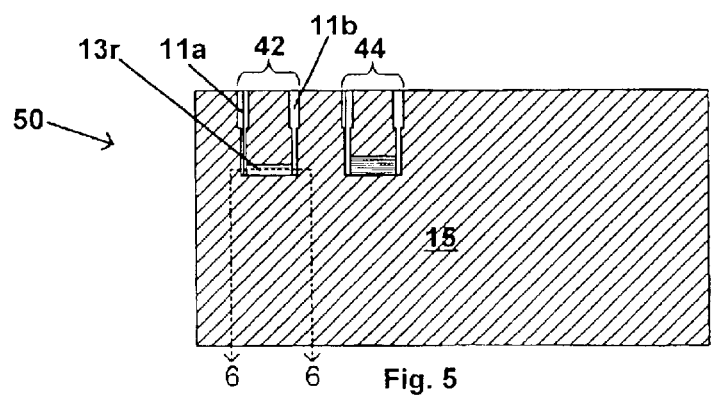
FIG. 5 is a schematic plan view of a printed circuit board, showing portions of the metal foil and the resistive metal layers and the prepreg layer, when the metal foil and resistive metal layers have been etched to form circuit elements.

The metal foils of the present invention having at least one resistive metal layer overlying and adhered to at least one side of the foil, and a layer of adhesion-promoting material overlying and adhered to the at least one resistive metal layer are particularly useful for forming laminates by bonding the treated copper foils to dielectric substrates, as shown, for example, in FIGS. 4 and 5. Such laminates provide dimensional and structural stability to the copper foils, and provide the substrate on which the printed circuit or wiring board components will be subsequently mounted. Use of the adhesion-promoting layer on the resistive foil enhances the bond and peel strength between the resistive foil and the dielectric substrate. One advantage of the metallic foils of the present invention having the adhesion-promoting layer on the resistive metal layer is that satisfactory bond and peel strength can be obtained without having to provide added surface roughening of the resistive metal layer prior to application of the dielectric laminate layer. Polar groups lacking in the bulk resin can be placed at the resistor/resin interface by coating resistive foils with adhesion promoting systems containing polar groups prior to lamination.

Figure 6:
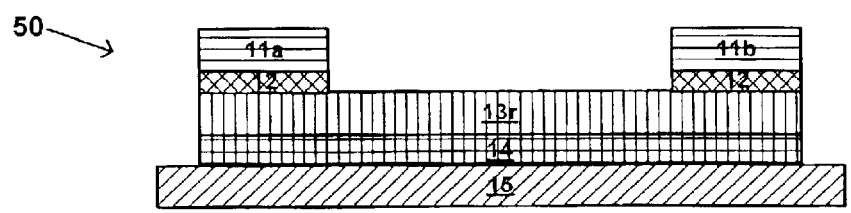
FIG. 6 is a schematic diagram representing a cross-sectional view of a laminate of the present invention, taken at line 6—6 of FIG. 5, including a metal foil, a stabilization layer, a resistive metal layer, an adhesion-promoting material layer, and a laminating material layer, when portions of the metal foil and the resistive metal layers have been etched to form circuit elements in a printed circuit board.

Laminates including conductive pads or traces interconnected by a resistive metal, obtained by bonding the metal foils of the present invention to a dielectric substrate and etching a portion of the metal foil, are illustrated in FIGS. 5 and 6. FIG. 5 is a schematic plan view of a laminate 50, such as a printed circuit board, showing portions of the conductive metal foil layer 11, the resistive metal layer 13 and the prepreg layer 15, in which portions of the metal foil 11, the stabilization layer 12 and the resistive metal layer 13 have been etched to form circuit elements. FIG. 6 is a schematic diagram representing a cross-sectional view of a laminate of the present invention, taken at line 6—6 of FIG. 5, including the conductive metal foil 11, the stabilization layer 12, the resistive metal layer 13, the adhesion-promoting material layer 14, and the prepreg layer 15, in which portions of the metal foil 11, the stabilization layer 12 and the resistive metal layer 13 have been etched to form circuit elements in a printed circuit board. As shown in FIGS. 5 and 6, the conductive pads or traces of the conductive metal 11 are interconnected by the resistive metal layer 13.

FIG. 5 depicts the laminate 50, in which the conductive foil layer 11, the stabilization layer 12, and the resistive metal layer 14 have been etched to define a circuit or wiring pattern. The circuit patterns visible in FIG. 5 include elements of the metal foil 11 and the resistive metal layer 13, which define a first resistor pattern 42 and a second resistor pattern 44. The first resistor pattern 42 is similar to the second resistor pattern 44, except that the resistive metal layer 13 of the second resistor pattern 42 is wider than the resistive metal layer 13 of the first resistor pattern 42.

In the laminate 50 shown in FIG. 5, the metal foil layer 11, the stabilization layer 12, the resistive metal layer 13 and the adhesion promoting layer 14, attached to the prepreg layer 15, have been etched to define the resistor patterns 42 and 44. Referring to the first resistor pattern 42, the pattern 42 includes metal foil leads 11a and 11b, each etched from the metal foil layer 11, and further includes a resistor element 13r, etched from the resistive metal layer 13.

FIG. 6 is a cross-sectional view taken at line 6—6 of FIG. 5. FIG. 6 shows the respective layers in the first resistor pattern 42, including the metal foil leads 11a and 11b, the stabilization layer 12, and the resistive metal forming the resistor element 13r. The resistor element 13r is adhered to the prepreg 15 by the adhesion-promoting layer 14.

In forming the circuit elements such as the first resistor pattern 42, in some portions of the laminate, such as the laminate 30 shown in FIG. 3, both the metal foil layer 11 and the resistive metal layer 13 are etched, while in other portions of the laminate, only the metal foil layer 11 is etched. Similarly, in the laminate 40 shown in FIG. 4, all of the metal foil layer 11, the stabilization layer 12, and the resistive metal layer 13 are etched, while in other portions of the laminate, only the metal foil layer 11 is etched. Depending on what elements are etched and what elements are retained, various circuit patterns may be formed, such as the resistor patterns 42, 44.

Methods and materials in accordance with the present invention are described in the following.

Conductive Metal Foils

The metal foils which can be utilized and treated in accordance with the present invention are electrically conductive metal foils. The choice of metal foil will depend upon the desired end use of the metal foil.

The conductive metal foils utilized in the present invention are, in one embodiment, a copper or copper-based alloy foil. While other metal foils may be used, in most printed circuit and wiring boards in use today, the conductive metal foil is a copper foil. Accordingly, the discussion in the specification generally will be directed to copper foils, although the general discussion should be understood to be applicable to other foils, particularly including copper-based alloy foils.

Copper, copper-based alloy and other metal foils are well known in the art and are made by various techniques. Wrought or rolled foil is produced by mechanically reducing the thickness of a metal (copper) or alloy (copper alloy) strip or ingot by a process such as rolling. Electrodeposited foil is produced by electrolytically depositing copper ions on a rotating cathode drum and then continuously peeling the deposited strip from the cathode. Foils can also be prepared by other procedures. For example, a copper foil can be prepared by electrodepositing or vapor depositing a layer of copper on a conductive carrier such as aluminum, copper or polymer film.

In one embodiment, the copper foil is an electrodeposited copper foil. The copper foils typically have nominal thicknesses ranging from about 0.0001 inch to about 0.02 inch (about 0.00025 cm to about 0.05 cm). Foil thickness is sometimes expressed in terms weight and typically the foils of the present invention have weights or thicknesses ranging from about 1/16 to about 14 ounce per square foot (oz/ft$^2$) (about 0.2 g/dm$^2$ to about 43 g/dm$^2$). The foils used as the base foil in this invention may be as-fabricated foils or annealed foils.

Electrodeposited copper foils have a smooth or shiny (drum) side and a rough or matte (copper deposit growth front) side. The stabilization metal layers described more fully below can be adhered to either the shiny or the matte side of the foil and in some instances are adhered to both sides. The resistive metal layers described more fully below can be adhered to either the shiny or the matte side of the foil.

In one embodiment, the side or sides of the foil to which the treatment layer is adhered is a "standard-profile surface," "low-profile surface" or "very-low-profile surface." The term "standard-profile surface" is used herein to refer to a foil surface having the roughness obtained in a standard raw foil. The term "low-profile surface" refers to a foil surface having a maximum $R_{tm}$ of about 2 µm or less. The term "very-low-profile surface" refers to a foil surface having a maximum $R_{tm}$ of about 1 µm or less. $R_{tm}$ is the mean of the maximum peak-to-valley vertical measurement from each of five, consecutive sampling measurements, and can be measured using a Surftronic 3 profilometer marketed by Rank Taylor Hobson, Ltd., Leicester, England.

When the copper foil products of the present invention are to be used in PCB applications, it is often desirable that the copper foils have controlled low profiles to provide etchability and impedance control.

Various chemicals can be applied to the raw foil to improve the characteristics of the foil surface. For example, the foil surfaces can be contacted with a solution comprising an acid such as sulfuric acid to effect microetching of the surface. In one embodiment, the surfaces of the conductive metal foil of the present invention are not treated in any way prior to deposition of the stabilization layer thereon.

Although the foils can be subjected to a surface roughening treatment prior to the application of at least one stabilizaton layer, it is a significant advantage of the invention that improved adhesive characteristics for the resistive foil can be achieved without subjecting the foil surface on which the resistive layer is applied to an added surface roughening treatment. Thus, in one embodiment of the invention, the foil used in the invention can be untreated or raw foil which has been cleaned of surface impurities but is otherwise characterized by the absence of any added surface roughening treatment on the side or sides to which the stabilization layer(s) is adhered. The term "added surface roughening treatment" refers to any treatment performed on or added to a base or raw foil that increases the roughness of the surface of the foil. These treatments include chemical treatments such as copper deposited electrolytically in nodular or powder form, or copper oxide which grows nodular or dendritic. When the resistive layer is applied to only one side of the foil, the opposite side of the foil may have added surface roughening, barrier stabilization, and adhesion promoter treatments applied which are well known in the art.

Stabilization Layers

In one embodiment, prior to application of the resistive metal layer in accordance with the present invention, the conductive metal foils are provided with a stabilization layer. In one embodiment, the stabilization layer is a metal oxide layer which is applied electrolytically. The layer may be applied in the form of either a metal or a metal oxide. In one embodiment, the stabilization layer includes zinc, nickel, palladium, titanium, tantalum, aluminum, iron, vanadium, chromium, chromium-based alloys, nickel-based alloys, oxides thereof and combinations thereof. In one embodiment, the stabilization layer is zinc oxide, chromium oxide, or a mixture thereof.

In one embodiment, the stabilization layer has a thickness in the range from about 5 to about 500 angstroms (Å). In one embodiment, the thickness may range from about 10 to about 400 angstroms (Å) and in some instances, will be within the range of from about 20 to about 100 angstroms (Å). In the foregoing, and throughout the specification and claims, the numerical limits of the disclosed ranges and ratios may be combined. Thus, for example, although not explicitly stated, the foregoing disclosure includes a range from about 20 to about 400 angstroms.

The stabilization layer can be obtained by electrodeposition techniques well known to those skilled in the art.

Resistive Metal Layer(s)

The conductive metal foils of the present invention have at least one resistive metal layer overlying and adhered to at least one side of the metal foil. As noted above, the resistive metal layer may be deposited over raw or untreated foil, or one or more stabilization layer first may be applied to the foil, after which the resistive metal is deposited thereover. In one embodiment, the stabilization layer is applied after the foil has been subjected to one or more added surface roughening treatments, and in one embodiment, no added surface roughening treatments are applied prior to application of the one or more stabilization layer.

In one embodiment, the shiny side of the foil has a resistive metal layer, and in another embodiment, the matte side of the foil has a resistive metal layer. In a further embodiment of the invention, the foil may have two or more consecutively applied resistive metal layers on either side, as described more fully below.

A variety of resistive metal layers may be present on the foils of the present invention. In one embodiment, the metal in the resistive metal layer is one or more selected from NiCr, NiCrAlSi, aluminum, nickel, zinc, titanium, vanadium, chromium, manganese, iron, tantalum, molybdenum, ruthenium, and alloys, oxides, nitrides and silicides thereof.

It is noted that the materials of which the resistive metal layer are formed may be considered to be conductors. However, these resistive metals have a volume resistivity less than that of copper, therefore they act as resistors in an otherwise copper circuit. Because the metal forming the resistive metal layer typically has a conductivity less than the copper layer to which it is attached, it acts essentially as a resistor between separated ends of the copper layer. As will be appreciated by those skilled in the art, the thickness and width of resistive layer, as well as the spacing between the ends of the copper layer connected by the resistive metal layer, i.e., the length of the resistive metal layer, will affect the overall or total resistance of a resistive element formed by the resistive metal layer.

In one embodiment, the resistive metal layer or layers is vapor deposited. In another embodiment, the resistive metal layer or layers is sputter deposited. Resistive metals may be deposited either as a single layer, in sequential layers or by co-deposition of more than one of the respective metals.

In one embodiment, the resistive metal layer is deposited by a method other than an electrodeposition plating method. In one embodiment, the resistive metal layer is deposited by a method other than an immersion plating method. In one embodiment, the resistive metal layer is deposited by a method other than an electroless plating method. In other embodiments, these methods may be used as appropriate, as determined by a person of skill in the art.

The resistive metal layer may be applied by any suitable method. In one embodiment, the resistive metal is applied directly onto the stabilization layer by vacuum deposition techniques such as sputtering, chemical vapor deposition, PECVD, electron beam deposition, thermal evaporation, ion plating (via substrate) or a combination of such processes. In one embodiment, the resistive metal is applied onto the matte side of the copper foil. In another embodiment, the resistive metal is applied onto the shiny side of the copper foil. In one embodiment, the resistive metal layer is applied by sputter deposition.

Suitable sputter deposition methods may be selected by those of ordinary skill in the art. For example, traditional DC magnetron sputtering, single or multiple cathode AC sputtering, asymmetric or symmetric bipolar pulsed DC sputtering, may be suitably selected.

Other deposition methods may be employed, for example, many CVD methods, for example PECVD, APCVD, RTCVD, or LPCVD may be suitable for deposition of the resistive metal layer.

In one embodiment, a copper foil 11 with a stabilization layer 12 thereon is conveyed into a deposition chamber. In another embodiment, a copper foil 11 with no stabilization layer is used. An electron beam gun directs a stream of electrons at a target comprised of a metal such that metallic species are knocked loose and deposited onto a surface of the copper foil 11. In one embodiment, the deposition process applies a metal over the matte side of the copper foil 11, onto the stabilization layer 12. In another embodiment, the deposition process applies a metal directly onto the matte side of the copper foil 11. In one embodiment, a single target is used. In another embodiment, multiple targets are used and, if desired, the metal may be applied to the shiny side of the foil 11.

In one exemplary embodiment, chromium is sputtered onto the copper foil by a method such as those described in commonly owned U.S. Pat. Nos. 6,489,034 and 6,489,035, the disclosure of each of which relating to sputter deposition methods is incorporated by reference herein.

In one exemplary embodiment, an alloy of 80 wt % nickel and 20 wt % chromium is sputter deposited onto a copper foil. In another exemplary embodiment, the thickness of the Ni/Cr alloy layer is about 100 angstroms (Å). The sheet resistivity of the Ni/Cr alloy is about 160 ohms/square. In another exemplary embodiment, an alloy of 56 wt % nickel, 38 wt % chromium, 4 wt % aluminum, and 2 wt % silicon is sputter deposited onto a copper foil. In one embodiment, the thickness of the Ni/Cr/Al/Si alloy layer is about 100 angstroms (Å). The sheet resistivity of the Ni/Cr/Al/Si alloy is about 290 ohms/square.

As will be understood by those of skill in the art, for sputtering, the specific sputter machine, the power and the linear speed of the copper foil through the machine will vary depending on the identify of the metal or metals applied, the thickness of the metal or metals applied, whether a stabilization layer is present, whether the foil has a smooth or roughened surface, and other factors known to those of skill in the art.

In one embodiment, alloys of nickel and chromium, or nickel and chromium together with aluminum and silicon as dopants, are used in forming the resistive metal layer on the copper foils. Other types of metals and conductive materials, generally having a volume resistivity greater than copper, may also be used in forming the resistive metal layer(s). By way of example and not limitation, platinum, tantalum, chromium, chrome silicide, tantalum nitrides and tantalum oxides may be used to form the resistive metal layer(s).

In one embodiment, the resistive metal layer overlies and is adhered to the base foil, and the thickness of the layer may range from about 50 Å to about 10,000 Å, and in another embodiment, the thickness of the resistive metal layer may range from about 80 Å to about 5,000 Å, and in yet another embodiment, the thickness may range from about 100 Å to about 1000 Å. When multiple resistive metal layers are used, each layer independently may have a thickness within the foregoing ranges.

In one embodiment, the resistive metal layer has a sheet resistivity in a range from about 10 ohms/square to about 5000 ohms/square. In another embodiment, the resistive metal layer has a sheet resistivity in a range from about 25 ohms/square to about 1000 ohms/square. In another embodiment, the resistive metal layer has a sheet resistivity in a range from about 50 ohms/square to about 500 ohms/square.

Adhesion-Promoting Layer

At least one surface or side of the conductive metal foils of the present invention has at least one resistive metal layer as described above, and at least one of the resistive metal layers has an adhesion-promoting layer overlying and adhered to the resistive metal layer. The adhesion-promoting layer is adapted for enhancing the adhesion between the foil with the resistive metal layer and a substrate such as a polymeric resin substrate used in the formation of PCBs. A wide variety of adhesion-promoting materials are known in the art for improving the adhesion of treated and untreated metal foils to other substrates including polymeric resin substrates, and such conventional adhesives can be utilized in the present invention. Improved adhesion is obtained as a result of the coaction between the adhesive and the resistive metal layers) which have been previously applied to the metal foil. For electrical purposes, high dielectric strength adhesives are selected. The adhesives or adhesion-promoters may be organic, organometallic or inorganic compounds.

In one embodiment, the adhesion-promoting layer is selected in view of the type of laminate to which the resistive metal layer is to be attached. The present inventors have discovered that, while some resistive metal layers may be directly attached to a suitable laminating material, in some cases, resistive metal layers do not provide satisfactory adhesion to particular laminating materials. Specific examples are given below.

In one embodiment, the adhesion-promoting material is a silane compound, and in one embodiment, an organosilicon compound or an organofunctional silane compound. Useful, exemplary compounds are discussed in detail below.

In embodiments in which the adhesion-promoting layer is an organosilicon compound such as the silane coupling agents, the thickness of the adhesion promoter is, e.g., from about 4 Å to about 2000 Å, in one embodiment from about 10 Å to about 1000 Å and in one embodiment from about 20 Å to about 500 Å.

In one embodiment, the adhesion-promoting layer comprises at least one organofunctional silane. Any of the silane compounds conventionally used in preparing PCBs can be used in the present invention.

In one embodiment, the silane coupling agent is represented by the formula (I):

$$R_{4-n}SiX_n \qquad (I)$$

wherein R is an alkyl or aryl group, or a functional group represented by the formula:

$$C_mH_{2m}Y$$

wherein m is from 0 to 20 and each Y is independently selected from amino, amido, hydroxy, alkoxy, halo, mercapto, carboxy, acyl, vinyl, allyl, styryl, epoxy, isocyanato, glycidoxy and acryloxy groups, X is a hydrolyzable group, such as alkoxy (e.g., methoxy, ethoxy, etc.), phenoxy, acetoxy, etc., or halogen (e.g., chlorine); and n is 1, 2, 3 or 4, and in one embodiment n is 3. The silane coupling agents represented by Formula (I) include halosilanes, aminoalkoxysilanes, aminophenylsilanes, phenylsilanes, heterocyclic silanes, N-heterocyclic silanes, acrylic silanes and mercapto silanes. Mixtures of two or more silanes also are useful. In one embodiment X is OR wherein R is an alkyl group containing up to about 5 carbon atoms or an aryl group containing up to about 8 carbon atoms. In other embodiments, m is an integer from 0 to 10 and more often from 1 to about 5.

Examples of silanes of Formula (I) wherein R is an alkyl or aryl group include methyltriethoxysilane, ethyltriethoxysilane, phenyltrimethoxysilane, phenyltriacetoxy silane, methyltrimethoxysilane, etc.

Examples of vinyl-containing silanes include vinyltrimethoxysilane, 1,3-divinyltetramethyldisilane, vinyltriethoxysilane, vinyltriisopropoxysilane, vinyl tris(2-methoxyethoxy) silane and vinyl tris(t-butylperoxy) silane.

The adhesion promoting material can be an epoxy silane represented by the formula (II):

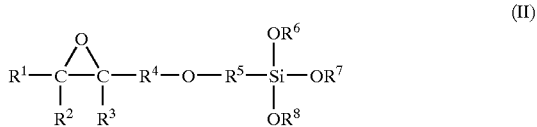

wherein: $R^1$, $R^2$ and $R^3$ are independently hydrogen or hydrocarbon groups; $R^4$ and $R^5$ are independently alkylene or alkylidene groups; and $R^6$, $R^7$ and $R^8$ are independently hydrocarbon groups. The hydrocarbon groups in one embodiment of Formula (II) contain 1 to about 10 carbon atoms, and in another embodiment 1 to about 6 carbon atoms, and in another embodiment 1 to about 4 carbon atoms. In one embodiment, these hydrocarbon groups are alkyl. The alkylene or alkylidene groups $R^4$ and $R^5$ in one embodiment contain from 1 to about 10 carbon atoms, in one embodiment 1 to about 6 carbon atoms, and in another embodiment 1 to about 4 carbon atoms, and in another embodiment, 1 or 2 carbon atoms. The alkylene and alkylidene groups can be methylene, ethylene, propylene, etc. One example of such a compound is represented by the formula (III):

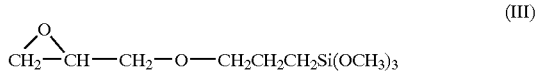

In another embodiment, the adhesion promoting material can be an acrylic silane represented by the formula (IV):

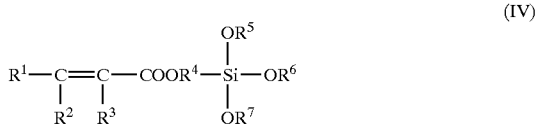

wherein: $R^1$, $R^2$ and $R^3$ are independently hydrogen or hydrocarbon groups; $R^4$ is an alkylene or alkylidene group; and $R^5$, $R^6$ and $R^7$ are independently hydrocarbon groups. The hydrocarbon groups in one embodiment of Formula (IV) contain 1 to about 10 carbon atoms, in one embodiment 1 to about 6 carbon atoms, and in another embodiment 1 to about 4 carbon atoms. These hydrocarbon groups are in one embodiment alkyl (e.g., methyl, ethyl, propyl, etc.). The alkylene and alkylidene groups in one embodiment contain from 1 to about 10 carbon atoms, and in another embodiment 1 to about 6 carbon atoms, and in another embodiment 1 to about 4 carbon atoms. The alkylene groups include methylene, ethylene, propylene, etc. An example of such compound is represented by the formula (IV-A):

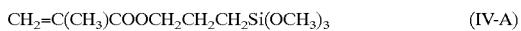

The adhesion promoting material also can be an amino silane represented by the formula (V):

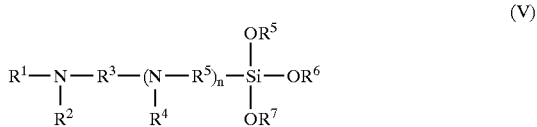

wherein: $R^1$, $R^2$ and $R^4$ are independently hydrogen or hydrocarbon groups; $R^3$ and $R^5$ are independently alkylene or alkylidene groups; $R^6$, $R^7$ and $R^8$ are independently hydrocarbon groups; and n is 0 or 1. The hydrocarbon groups in one embodiment of Formula (V) contain 1 to about 10 carbon atoms, and in another embodiment 1 to about 6 carbon atoms, and in another embodiment 1 to about 4 carbon atoms. These hydrocarbon groups are in one embodiment alkyl (e.g., methyl, ethyl, propyl, etc.). The alkylene and alkylidene groups in one embodiment contain from 1 to about 10 carbon atoms, and in another embodiment 1 to about 6 carbon atoms, and in another embodiment 1 to about 4 carbon atoms. The alkylene groups include methylene, ethylene, propylene, etc. Examples of such silanes include those represented by the formulae (V-A) and (V-B):

The mercapto adhesion promoting materials can be represented by the formula (VI):

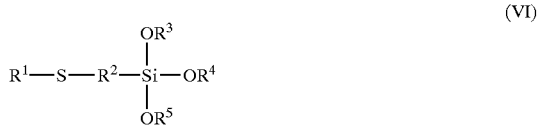

wherein $R^1$ is hydrogen or a hydrocarbon group; $R^2$ is an alkylene or alkylidene group; and $R^3$, $R^4$ and $R^5$ are independently hydrocarbon groups. The hydrocarbon groups in one embodiment of Formula (VI) contain 1 to about 10 carbon atoms, and in another embodiment 1 to about 6 carbon atoms, and in another embodiment 1 to about 4 carbon atoms. These hydrocarbon groups are in one embodiment alkyl (e.g., methyl, ethyl, propyl, etc.). The alkylene and alkylidene groups in one embodiment contain from 1 to about 10 carbon atoms, and in another embodiment 1 to about 6 carbon atoms, and in another embodiment 1 to about 4 carbon atoms. These groups are in one embodiment alkylene (e.g., methylene, ethylene, propylene, etc.). One example of such a compound is represented by the formula (VI-A):

In yet another embodiment, the adhesion promoting material can be represented by the formula (VII):

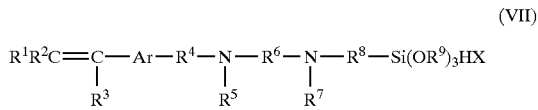

wherein: $R^1$, $R^2$, $R^3$, $R^5$ and $R^7$ are independently hydrogen or hydrocarbon groups; $R^4$, $R^6$ and $R^8$ are independently alkylene or alkylidene groups; each $R^9$ is independently a hydrocarbon group; Ar is an aromatic group; and X is a halogen. The hydrocarbon groups in one embodiment of Formula (VII) contain 1 to about 10 carbon atoms, and in another embodiment 1 to about 6 carbon atoms, and in another embodiment 1 to about 4 carbon atoms. These hydrocarbon groups are in one embodiment alkyl (e.g., methyl, ethyl, propyl, etc.). The alkylene and alkylidene groups in one embodiment contain from 1 to about 10 carbon atoms, and in another embodiment 1 to about 6 carbon atoms, and in another embodiment 1 to about 4 carbon atoms. These groups are in one embodiment alkylene (e.g., methylene, ethylene, propylene, etc.).

In Formula (VII), Ar is an aromatic or alicyclic aliphatic group. The aromatic groups in Formula (VII) can be mononuclear, e.g., benzene; polynuclear wherein the aromatic nucleus is of the fused type with the aromatic nucleus being fused at two points to another nucleus, e.g., naphthalene, or of the linked type wherein at least two nuclei (mononuclear or polynuclear) are linked through bridging linkages to each other. The bridging linkages can be carbon—carbon single bonds, ether linkages, keto linkages, sulfide linkages, sulfur atoms, sulfinyl linkages, sulfonyl linkages, alkylene linkages, alkylidene linkages, amino linkages, etc. In one embodiment, the aromatic group is a benzene nucleus. These aromatic groups can be alkyl-substituted aromatic groups wherein one or more alkyl groups (e.g., $C_1$–$C_{10}$) are attached to the aromatic nucleus.

The alicyclic group in Formula (VII) can be saturated or unsaturated, and in one embodiment has from 3 to 6 carbon atoms, and in another embodiment, 5 or 6 carbon atoms. These alicyclic groups can be alkyl-substituted alicyclic groups wherein one or more alkyl groups (e.g., $C_1$–$C_{10}$) are attached to ring carbon atoms. Examples include groups derived from cyclopropane, cyclobutane, cyclopentane, cyclopentene, 1,3-cyclopentadiene, cyclohexane, cyclohexene, 1,3-cyclohexadiene, etc.

The halogen X is, in one embodiment, fluorine, chlorine or bromine, and in another embodiment chlorine.

An example of such a silane is represented by the formula (VII-A):

$$CH_2=CHC_6H_4CH_2NHCH_2CH_2NHCH_2CH_2CH_2Si(OCH_3)_3 \quad \text{(VII-A)}$$

In yet another embodiment, the adhesion promoting material can be represented by the formula (VII):

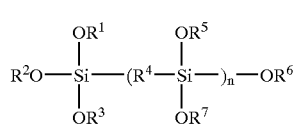

(VIII)

wherein $R^1$, $R^2$, $R^3$, $R^4$, $R^5$, $R^6$ and $R^7$ are independently hydrocarbon groups; $R^4$ is an alkylene or alkylidene group; and n is 0 or 1. The hydrocarbon groups in one embodiment of formula (VII) contain 1 to about 10 carbon atoms, and in another embodiment 1 to about 6 carbon atoms, and in another embodiment 1 to about 4 carbon atoms. These hydrocarbon groups are in one embodiment alkyl (e.g., methyl, ethyl, propyl, etc.). The allkylene and alkylidene group in one embodiment contains from 1 to about 10 carbon atoms, and in another embodiment 1 to about 6 carbon atoms, and in another embodiment 1 to about 4 carbon atoms. This group is in one embodiment alkylene (e.g., methylene, ethylene, propylene, etc.). Examples of such compounds include tetraethoxy silane (TEOS) and $(CH_3O)_3SiCH_2CH_2Si(OCH_3)_3$.

In one embodiment, the adhesion promoting materials include aminopropyltrimethoxy silane, tetraethoxy silane, bis(2-hydroxyethyl)-3-aminopropyltriethoxy silane, 3-(N-styrylmethyl-2-aminoethylamine) propyltrimethoxy silane, 3-glycidoxypropyltrimethoxy silane, N-methylaminopropyltrimethoxy silane, 2-(2-aminoethyl-3-aminopropyl)trimethoxy silane, and N-phenylaminopropyltrimethoxy silane, and mixtures thereof.

In one embodiment, a silane adhesion-promoting agent mixture is a solution or other medium (as further described below) containing 3-glycidoxypropyltrimethoxy silane and phenyltriethoxy silane. The weight ratio of the former to the latter in one embodiment ranges from about 1:10 to about 10:1, and in another embodiment about 1:5 to about 5:1, and in one embodiment the weight ratio is about 1:3.

In another embodiment, a silane adhesion-promoting agent mixture is a solution containing 3-glycidoxypropyltrimethoxy silane and tetraethoxy silane in a weight ratio of from about 1:5 to about 5:1. In one preferred embodiment the weight ratio is about 1:1.

In another embodiment, a silane adhesion-promoting agent is a solution comprising tetraethoxy silane (TEOS), have a formula $(CH_3CH_2O)_4Si$.

In another embodiment, a silane adhesion-promoting agent mixture is a solution or other medium (as further described below) containing N-methylaminopropyltrimethoxy silane and chloropropyltrimethoxy silane. The weight ratio of the former to the latter in one embodiment ranges from about 1:10 to about 10:1, and in another embodiment about 1:5 to about 5:1, and in one embodiment the weight ratio is about 1:1.

In still another embodiment, a silane adhesion-promoting agent mixture is a solution or other medium (as further described below) containing 3-(N-styrylmethyl-2-aminoethyl amino)propyltrimethoxy silane and N-methylaminopropyltrimethoxy silane. The weight ratio of the former to the latter in one embodiment ranges from about 1:10 to about 10:1, and in another embodiment about 1:5 to about 5:1, and in one embodiment the weight ratio is about 1:1.

In yet another embodiment, a silane adhesion-promoting agent mixture is a solution or other medium (as further described below) containing 3-glycidoxypropyltrimethoxy silane and N-methylaminopropyltrimethoxy silane. The weight ratio of the former to the latter in one embodiment ranges from about 1:10 to about 10:1, and in another embodiment about 1:5 to about 5:1, and in one embodiment the weight ratio is about 1:3.

When the adhesion-promoting layer is an organofunctional silane such as described above, the thickness of the adhesion-promoting layer is generally in the range from about 4 angstroms (Å) to about 2000 Å, and in one embodiment, from about 10 Å to about 1000 Å, and in yet another embodiment, from about 20 Å to about 500 Å.

Other organic materials which are also useful in the adhesion-promoting layer include: benzotriazole and its derivatives; metal salts of organic acids such as sodium and potassium citrates; organic amines; cyclic alkylene ureas; orthoesters; etc. Inorganic adhesion-promoting layers may comprise phosphorus or chromium-containing compounds.

In another embodiment the adhesion-promoting layers used in the present invention may comprise various organometallic compounds such as those based on silicon, titanium, zirconium, aluminum, etc.

A variety of titanates useful as adhesion-promoters are available commercially such as from Kenrich Petrochemicals, Inc. under the trade designation Ken-React®. The types of titanates include: monoalkoxy titanates such as isopropyl tri(N-ethylaminoethylamino) titanate, isopropyl tri-isostearoyl titanate and titanium di(dioctylpyrophosphate) oxyacetate; coordinate titanates such as tetraisopropyl di(dioctylphosphito)titanate; and neoalkoxy titanates such as neoalkoxy tri(p-N-(β-aminoethyl)aminophenyl)titanate. Other types include chelate, quaternary and cycloheteroatom titanates.

Zirconium adhesion promoters are also available from, Kenrich. Typical zirconates include neoalkoxy trisneodecanoyl zirconate, neoalkoxy tris(dodecanoyl) benzene sulfonyl zirconate, neoalkoxy tris(m-aminophenyl) zirconate, ammonium zirconium carbonate and zirconium propionate.

The adhesion-promoting layers present on the metal bodies and foils of the present invention may be applied to the resistive metal layer using known application methods which include reverse roller coating, doctor blade coating, dipping, painting, spraying, brushing, electrode-position, vapor deposition, etc. The adhesion-promoting material which can be applied by any of these procedures may be neat or dispersed or dissolved in a suitable medium (as further described below). The process of applying the adhesion-promoting materials may be repeated, if desired, several times. The adhesion-promoting materials generally are applied in a suitable medium, described as including a solution, emulsion, suspension, dispersion or other mixture, to the resistive metal layer surface. More specifically, the adhesion promoting materials can be applied to the resistive metal layer in the form of a solution in water, a mixture of water and alcohol, or a suitable organic solvent, or as an aqueous emulsion or suspension of the adhesion promoting material, or as an aqueous emulsion of a solution of the adhesion promoting material in a suitable organic solvent. Conventional organic solvents may be used for the adhesion promoting material and include, for example, alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the adhesion promoting material may be formed in conventional manner using conventional dispersants and surfactants, including non-ionic dispersants. It may be convenient to contact the metal surface with an aqueous emulsion of the adhesion promoting material. The concentration of the adhesion promoting material in such solutions or emulsions can be up to about 100% by weight of the adhesion promoting material, but in one embodiment is in the range of about 0.1% to about 5% by weight, and in another embodiment about 0.3% to about 1% by weight. The process of coating with the adhesion promoting material may be repeated, if desired, several times. However, a single coating step gives generally useful results.

The application of the adhesion promoting material to the treatment layer is typically effected at a temperature of about 15° C. to about 45° C., and in another embodiment about 20° C. to about 30° C. Following application of the adhesion promoting material, it can be heated to a temperature of about 60° C. to about 170° C., in one embodiment about 90° C. to 150° C., for about 0.1 to about 5 minutes, more often from about 0.2 to about 2 minutes to enhance drying of the surface.

Lamination to Insulating Materials

As described above, the multiple layer foil, such as that shown in FIG. 1, including the conductive metal foil 11, the resistive metal layer 13 and the adhesion-promoting layer 14, may be laminated to an insulating material layer 15 such as one or more plies of a fiberglass fabric pre-impregnated with an appropriate formulation of curable organic resins, to form a laminate, such as that shown in FIG. 3. In another embodiment, the multiple layer foil, such as that shown in FIG. 2, including the conductive metal foil 11, the stabilization layer 12, the resistive metal layer 13 and the adhesion-promoting layer 14, may be laminated to an insulating material layer 15 such as one or more plies of a fiberglass fabric pre-impregnated with an appropriate formulation of curable organic resins, to form a laminate, such as that shown in FIG. 4. Such an insulating material layer is often referred to as a prepreg, and may be generally referred to as a laminating material. Herein, the term "laminating material" generally refers to such an insulating material layer, for example, a prepreg, as known in the art. The present invention is not limited to particular types of laminating or prepreg materials. It has been discovered as part of the invention that certain combinations of laminating materials and resistive metals perform better with particular adhesion-promoting materials.

In one embodiment, the multiple layer foil and the pre-impregnated fiberglass fabric or prepreg are bonded together utilizing conventional procedures for bonding metal foils to insulating or laminating material layers. For example, a prepreg may be bonded to the resistive metal layer 13 via the adhesion-promoting layer 14 by methods such as pressing at about 250 to about 750 psi (about 17.6 to about 52.7 kg/cm$^2$) and at a temperature in the range from about 350° to about 450° F. (about 177° to about 232° C.) for about 40 minutes to about 2 hours to obtain a laminate which includes an insulating or prepreg layer, an resistive metal layer bound to the insulating material layer by the adhesion-promoting layer, a stabilization layer and a conductive metal foil layer, adhered together in this order. In the step of laminating, other known methods may be used for applying an insulating material layer 15 to the metal foil 11, the resistive metal layer 13 and the adhesion-promoting layer 14.

It is also recognized by the inventors that the insulating material layer need not necessarily be a prepreg. In this regard, a multiple layer foil which includes the resistive layer, such as the multiple layer foil 10 shown in FIG. 1, may be bonded to an organic polymer such as a polyester film.

Useful dielectric substrates may be prepared by impregnating woven glass reinforcement materials with partially cured resins, for example, epoxy resins (e.g., difunctional, tetrafunctional and multifunctional epoxies). Other useful resins include amino type resins produced from the reaction of formaldehyde and urea or formaldehyde and melamine, polyesters, phenolics, silicones, polyamides, polyimides, diallyl phthalates, phenylsilanes, polybenzimidazoles, diphenyloxides, polytetrafluoroethylenes, cyanate esters, and the like. These dielectric substrates are sometimes referred to as prepregs.

The present invention addresses problems encountered in adhering the resistive metal layer to the prepreg layers. As discussed above, in some cases, the resistive metal layer does not adhere well to the prepreg material, and the adhesion-promoting layer provides additional adhesion so that acceptable peel strengths can be obtained from the foils of the present invention.

In preparing the laminates, it is useful for both the prepreg material and the multilayer foil to be provided in the form of long webs of material rolled up in rolls. In one embodiment these long webs of foil and prepreg are laminated using a continuous process. In this process a continuous web of the inventive foil with the resistive metal layer(s) and adhesion-promoting layer(s) adhered thereto is brought into contact with a continuous web of prepreg material with the adhesive layer of the foil contacting the prepreg material under laminating conditions to form a laminate structure. This laminate structure is then cut into rectangular sheets and the rectangular sheets are then laid-up or assembled in stacks of assemblages.

In one embodiment the long webs of foil and prepreg material are first cut into rectangular sheets and then subjected to lamination. In this process rectangular sheets of the inventive foil and rectangular sheets of the prepreg material are then laid-up or assembled in stacks of assemblages.

Each assemblage may comprise a prepreg sheet with a sheet of foil on either side thereof, and in each instance, the side (or one of the sides) of the copper foil sheet with the adhesion-promoting layer adhered thereto is positioned adjacent the prepreg. The assemblage may be subjected to conventional laminating temperatures and pressures between the plates of laminating presses to prepare laminates comprising sandwiches of a sheet of prepreg between sheets of copper foil.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Typically, the laminating operation will involve pressures in the range of from about 200 to about 750 psi (about 14 to about 53 kg/cm$^2$), more often 200 to 500 psi (about 14 to about 35 kg/cm$^2$), temperatures in the range of from about 70° C. to 400° C., more often about 70° C. to about 200° C., and a laminating cycle of from about a few minutes to about 2 hours. The finished laminate may then be utilized to prepare printed circuit boards (PCB).

In another embodiment, the laminate is subjected to a subtractive copper and resistive metal layer etching process to form electrically conductive lines or an electrically conductive pattern, and to form resistive elements as part of a process for making a multilayered circuit board. Similarly, subtractive etching processes are well known, an example of which is disclosed in U.S. Pat. No. 5,017,271, which is incorporated herein by reference for its teachings relating to subtractive etching.

The definition of the circuit patterns and the etching methods used are well known in the art and so need not be discussed in detail herein.

A number of manufacturing methods are available for preparing PCBs from laminates. Additionally, there is a myriad of possible end use applications including radios, televisions, computers, etc., for the PCB's. These methods and end uses are known in the art.

EXAMPLES

The following examples are provided for purposes of illustrating the materials useful as the adhesion-promoting layer. Unless otherwise indicated in the following examples as well as throughout the specification and claims, all parts and percentages are by weight, all temperatures are in degrees centigrade, and all pressures are at or near atmospheric.

The improved adhesion exhibited between the resistive metal layer of the multilayer foil of the present invention and the polymeric substrates such as multifunctional epoxy prepregs and tetrafunctional epoxy prepregs is demonstrated by laminating resistive copper foils in the Examples described below to various prepregs, and thereafter evaluating the laminates for initial peel strength in pounds/inch using the standard Peel Strength Test of IPC TM-650. For comparison, each of the resistive metal layers is also laminated to the prepregs without the adhesion-promoting material and evaluated. The results of some of these tests are summarized in the following Examples.

In the following Examples, in each case a multilayer foil, such as the multilayer foil 10 shown in FIG. 1 or the multilayer foil 20 shown in FIG. 2 is prepared. The metal foil layer 11 is treated (in the FIG. 2 embodiment) to apply a stabilization layer 12, and then a resistive metal layer 13 is sputter deposited onto the stabilization layer 12, to form a multilayer foil. Thereafter, the indicated adhesion-promoting material is applied to the resistive metal layer 13 to form the multilayer foil 20, such as that shown in FIG. 2. In the Comparative Examples (Controls), no adhesion-promoting material is applied to the resistive metal layer 13. Thereafter, the multilayer foil is then applied to the prepreg material by laminating, to form a laminate such as that shown in FIG. 3 or 4. The laminating operation is carried out at a pressure of about 400 psi (about 28 kg/cm$^2$), a temperature of about 170° C., for a period of about 1–4 hours. The laminates are then tested for peel strength by the IPC TM-650 test.

Results of the tests of these Examples are given below.

Example 1

| | |
|---|---|
| Multilayer Foil: | 100NC18R |
| Stabilization Metal: | Zn & Cr oxide |
| Resistive Metal: | NiCr |
| Prepreg: | 226 |
| Adhesion Promoter: | 0.5% TEOS |
| Peel Strength: | 4.34 lb/in |

Example 2

| | |
|---|---|
| Multilayer Foil: | 100NC18R |
| Stabilization Metal: | Zn & Cr oxide |
| Resistive Metal: | NiCr |
| Prepreg: | 226 |
| Adhesion Promoter: | 1% TEOS |
| Peel Strength: | 4.46 lb/in |

Example 3

| | |
|---|---|
| Multilayer Foil: | 100NC18R |
| Stabilization Metal: | Zn & Cr oxide |
| Resistive Metal: | NiCr |
| Prepreg: | 226 |
| Adhesion Promoter: | 2% IA-100A |
| Peel Strength: | 3.22 lb/in |

Comparative Example 4

Control

| | |
|---|---|
| Multilayer Foil: | 100NC18R |
| Stabilization Metal: | Zn & Cr oxide |
| Resistive Metal: | NiCr |
| Prepreg: | 226 |
| Adhesion Promoter: | None |
| Peel Strength: | 1.5 lb/in |

Example 5

| | |
|---|---|
| Multilayer Foil: | 100NC18R |
| Stabilization Metal: | Zn & Cr oxide |

Example 6

| | |
|---|---|
| Multilayer Foil: | 100NC18R |
| Stabilization Metal: | Zn & Cr oxide |
| Resistive Metal: | NiCr |
| Prepreg: | N4000-6 |
| Adhesion Promoter: | 1% TEOS |
| Peel Strength: | 4.44 lb/in |

Comparative Example 7

Control

| | |
|---|---|
| Multilayer Foil: | 100NC18R |
| Stabilization Metal: | Zn & Cr oxide |
| Resistive Metal: | NiCr |
| Prepreg: | N4000-6 |
| Adhesion Promoter: | None |
| Peel Strength: | 1.43 lb/in |

Example 8

| | |
|---|---|
| Multilayer Foil: | 50NC18R |
| Stabilization Metal: | Zn & Cr oxide |
| Resistive Metal: | NiCr |
| Prepreg: | RO 4403 |
| Adhesion Promoter: | 1% vinyl |
| Peel Strength: | 2.92 lb/in |

Comparative Example 9

Control

| | |
|---|---|
| Multilayer Foil: | 50NC18R |
| Stabilization Metal: | Zn & Cr oxide |
| Resistive Metal: | NiCr |
| Prepreg: | RO 4403 |
| Adhesion Promoter: | None |
| Peel Strength: | 0.0 lb/in (no adhesion) |

Example 10

| | |
|---|---|
| Multilayer Foil: | 50AS18R |
| Stabilization Metal: | Zn & Cr oxide |
| Resistive Metal: | NiCrAlSi |
| Prepreg: | RO 4403 |
| Adhesion Promoter: | 1% methacrylo |
| Peel Strength: | 3.71 lb/in |

Comparative Example 11

Control

| | |
|---|---|
| Multilayer Foil: | 50AS18R |
| Stabilization Metal: | Zn & Cr oxide |
| Resistive Metal: | NiCrAlSi |
| Prepreg: | RO 4403 |
| Adhesion Promoter: | None |
| Peel Strength: | 0.0 lb/in (no adhesion) |

Example 12

| | |
|---|---|
| Multilayer Foil: | 50AS18R |
| Stabilization Metal: | Zn & Cr oxide |
| Resistive Metal: | NiCrAlSi |
| Prepreg: | 55RT |
| Adhesion Promoter: | 1% AMEO |
| Peel Strength: | 3.61 lb/in |

Example 13

| | |
|---|---|
| Multilayer Foil: | 50AS18R |
| Stabilization Metal: | Zn & Cr oxide |
| Resistive Metal: | NiCrAlSi |
| Prepreg: | 55RT |
| Adhesion Promoter: | 1% IMEO |
| Peel Strength: | 3.65 lb/in |

Example 14

| | |
|---|---|
| Multilayer Foil: | 50AS18R |
| Stabilization Metal: | Zn & Cr oxide |
| Resistive Metal: | NiCrAlSi |
| Prepreg: | 55RT |
| Adhesion Promoter: | 1% ureido |
| Peel Strength: | 2.92 lb/in |

Comparative Example 15

Control

| | |
|---|---|
| Multilayer Foil: | 50AS18R |
| Stabilization Metal: | Zn & Cr oxide |
| Resistive Metal: | NiCrAlSi |
| Prepreg: | 55RT |
| Adhesion Promoter: | None |
| Peel Strength: | 1.52 lb/in |

Example 16

| | |
|---|---|
| Multilayer Foil: | 100AS35R |
| Stabilization Metal: | Zn & Cr oxide |
| Resistive Metal: | NiCrAlSi |
| Prepreg: | Driclad |

—continued (from previous)

| | |
|---|---|
| Resistive Metal: | NiCr |
| Prepreg: | N4000-6 |
| Adhesion Promoter: | 0.5% TEOS |
| Peel Strength: | 3.52 lb/in |

-continued

| | |
|---|---|
| Adhesion Promoter: | 1% AMEO |
| Peel Strength: | 5.58 lb/in |

Example 17

| | |
|---|---|
| Multilayer Foil: | 100AS35R |
| Stabilization Metal: | Zn & Cr oxide |
| Resistive Metal: | NiCrAlSi |
| Prepreg: | Driclad |
| Adhesion Promoter: | 1% IMEO |
| Peel Strength: | 3.03 lb/in |

Comparative Example 18

Control

| | |
|---|---|
| Multilayer Foil: | 100AS35R |
| Stabilization Metal: | Zn & Cr oxide |
| Resistive Metal: | NiCrAlSi |
| Prepreg: | Driclad |
| Adhesion Promoter: | None |
| Peel Strength: | 1.09 lb/in |

Example 19

| | |
|---|---|
| Multilayer Foil: | 25NC18R |
| Stabilization Metal: | None |
| Resistive Metal: | NiCr |
| Prepreg: | 35N |
| Adhesion Promoter: | 1% IMEO |
| Peel Strength: | 2.53 lb/in |

Comparative Example 20

Control

| | |
|---|---|
| Multilayer Foil: | 25NC18R |
| Stabilization Metal: | None |
| Resistive Metal: | NiCr |
| Prepreg: | 35N |
| Adhesion Promoter: | None |
| Peel Strength: | 0.11 lb/in |

Adhesion-Promoting Materials in Examples:
(In all cases, the adhesion-promoting materials are mixed in aqueous solution at the indicated concentrations in volume percent.)
TEOS=tetraethoxy silane
IA-100A=N-[2'-hydroxy-3'-(3"-trimethoxysilyl)-propoxy] propyl imidazole
AMEO=3-aminopropyltriethoxy silane
IMEO=N-[(3-triethoxysilyl)propyl]4,5-dihydroimidazole
Ureido=N-(triethoxysilylpropyl)urea
Methacrylo=3-(trimethoxysilyl)propyl methacrylate
Prepreg Materials in Examples:
226 Fiberglass reinforced tetrafunctional epoxy FR-4 prepreg, Tg=140° C., manufactured by Polyclad.
N4000-6 Fiberglass reinforced multifunctional FR4 epoxy prepreg, Tg=175° C., manufactured by Nelco.
RO 4403 Fiberglass reinforced hydrocarbon/ceramic thermoset prepreg, manufactured by Rogers Corp.
55RT Multifunctional epoxy resin with non-woven aramid reinforcement, Tg=180° C., 53% resin content, manufactured by Arlon.
35N Fiberglass reinforced Keramid 701 non-MDA polyimide prepreg, Tg=260° C., manufactured by Arlon.
Driclad High Tg FR-4 epoxy/fiberglass prepreg, Tg=140° C., manufactured by International Business Machines.
Multilayer Foils in Examples:
100NC18R: 100 ohm/sq, NiCr on ½ oz/ft$^2$ reverse treated copper foil, manufactured by Gould Electronics, Inc.
50NC18R: 50 ohm/sq, NiCr on ½ oz/ft$^2$ reverse treated copper foil, manufactured by Gould Electronics, Inc.
50AS18R: 50 ohm/sq, NiCrAlSi on ½ oz/ft$^2$ reverse treated copper foil, manufactured by Gould Electronics, Inc.
100AS35R: 100 ohm/sq, NiCrAlSi on 1 oz/ft$^2$ reverse treated copper foil, manufactured by Gould Electronics, Inc.
Stabilization Layers in Examples:
Zn & Cr oxide: Applied by electrodeposition.
None: Copper surface acid cleaned to remove Zn & Cr oxides prior to sputtering.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A process to enhance adhesion of resistive foil to laminating materials, comprising:
   providing a metal foil;
   depositing at least one resistive metal layer on at least one side of the metal foil, wherein the resistive metal is selected from the group consisting of: NiCr, NiCrAlSi, aluminum, nickel, zinc, titanium, vanadium, manganese, iron, tantalum, molybdenum, ruthenium, and alloys, oxides, nitrides, or silicides thereof;
   applying at least one layer of at least one adhesion-promoting material over and adhered to the at least one resistive metal layer; and
   laminating the at least one resistive metal layer to a laminating material, the adhesion-promoting material providing enhanced adhesion between the resistive metal layer and the laminating material, wherein a laminate formed by the laminating step has a peel strength of at least 2.5 lb/in.

2. The process of claim 1, wherein the peel strength is at least 2.9 lb/in.

3. The process of claim 1, wherein the adhesion promoting material increases the peel strength by at least 1.3 lb/in compared to the peel strength when the resistive foil is laminated to the laminating material in the absence of the adhesion-promoting material.

4. The process of claim 1, wherein the at least one resistive metal layer is applied by vapor deposition or sputter deposition.

5. The process of claim 1 wherein the thickness of the resistive metal layer is from about 10 angstroms to about 3000 angstroms.

6. The process of claim 1, further comprising a step of applying a stabilization layer to the metal foil prior to depositing the resistive metal layer.

7. The process of claim 6 wherein the stabilization layer comprises oxides of zinc, nickel, chromium and mixtures thereof.

8. The process of claim 1 wherein the metal foil is an electrodeposited copper foil having a shiny side and a matte side, and the resistive metal layer is sputter deposited on the matte side of the metal foil.

9. The process of claim 8 wherein the metal of the resistive metal layer is NiCr or NiCrAlSi.

10. The process of claim 1 wherein a second resistive metal layer is deposited on the at least one resistive metal layer, and the second resistive metal is selected from the group consisting of: NiCr, NiCrAlSi, aluminum, nickel, zinc, titanium, vanadium, manganese, iron, tantalum, molybdenum, ruthenium, and alloys, oxides, nitrides, or silicides thereof.

11. The process of claim 1 wherein the adhesion-promoting material is at least one silane compound represented by the formula

wherein R Is an alkyl or aryl group or a functional group represented by the formula $C_mH_{2m}Y$ wherein m is from 0 to 20 and each Y is independently selected from the group consisting of amino, amido, hydroxy, alkoxy, halo, mercapto, carboxy, aryl, vinyl, allyl, styryl, epoxy, isocyanate, glycidoxy, and acryloxy groups, X is a hydrolyzable group; and n is 1, 2, 3 or 4.

12. The process of claim 11, wherein n is 4.

13. The process of claim 1, wherein the adhesion-promoting material comprises at least one epoxy silane represented by the formula

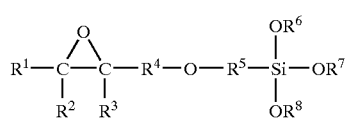

wherein $R^1$, $R^2$ and $R^3$ are independently hydrogen or $C_1$–$C_{10}$ hydrocarbon groups; $R^4$ and $R^5$ are independently $C_1$–$C_{10}$ alkylene or alkylidene groups; and $R^6$, $R^7$ and $R^8$ are Independently $C_1$–$C_{10}$ hydrocarbon groups.

14. The process of claim 1 wherein the adhesion-promoting material comprises at least one acrylic silane represented by the formula:

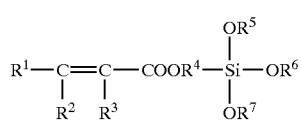

wherein: $R^1$, $R^2$ and $R^4$ are independently hydrogen or $C_1$–$C_{10}$ hydrocarbon groups; $R^4$ is a $C_1$–$C_{10}$ alkylene or alkylidene group; and $R^5$, $R^6$ and $R^7$ are independently $C_1$–$C_{10}$ hydrocarbon groups.

15. The process of claim 1 wherein the adhesion promoting material comprises at least one amino silane represented by the formula:

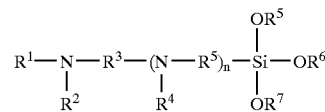

wherein: $R^1$, $R^2$ and $R^4$ are independently hydrogen or $C_1$–$C_{10}$ hydrocarbon groups, $R^3$ and $R^5$ are independently $C_1$–$C_{10}$ alkylene or alkylidene groups; $R^6$, $R^7$ and $R^8$ are independently $C_1$–$C_{10}$ hydrocarbon groups; and n is 0 or 1.

16. The process of claim 1 wherein the adhesion-promoting material comprises at least one mercapto silane coupling agents represented by the formula:

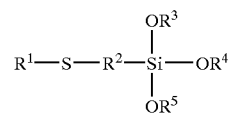

wherein $R^1$ is hydrogen or a $C_1$–$C_{10}$ hydrocarbon group; $R^2$ is a $C_1$–$C_{10}$ alkylene or alkylidene group; and $R^3$, $R^4$ and $R^5$ are independently $C_1$–$C_{10}$ hydrocarbon groups.

17. The process of claim 1 wherein the adhesion-promoting material comprises at least one compound represented by the formula:

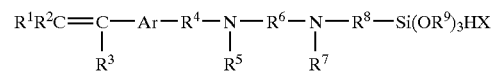

wherein: $R^1$, $R^2$, $R^3$, $R^5$ and $R^7$ are independently hydrogen or $C_1$–$C_{10}$ hydrocarbon groups; $R^4$, $R^6$ and $R^8$ are independently $C_1$–$C_{10}$ alkylene or alkylidene groups; each $R^9$ is independently a $C_1$–$C_{10}$ hydrocarbon group; Ar is an aromatic group; and X is a halogen.

18. The process of claim 1 wherein the adhesion-promoting material comprises at least one compound represented by the formula:

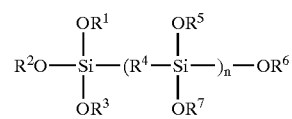

wherein $R^1$, $R^2$, $R^3$, $R^5$, $R^6$ and $R^7$ are independently $C_1$–$C_{10}$ hydrocarbon groups; $R^4$ is a $C_1$–$C_{10}$ alkylene or alkylidene group; and n is 0 or 1.

19. The process of claim 1, wherein the metal foil is a copper foil or a copper alloy foil.

20. The process of claim 1, wherein the metal foil is not roughened prior to application of the resistive metal layer.

21. A resistor assembly in a printed circuit board having conductive traces or pads interconnected by a resistive metal, comprising a laminate formed according to the process of claim 1.

22. A metal body comprising:
a metal foil layer;
a resistive metal layer overlying the metal foil layer, wherein the resistive metal is selected from the group consisting of: NiCr, NiCrAlSi, aluminum, nickel, zinc, titanium, vanadium, manganese, iron, tantalum, molybdenum, ruthenium, and alloys, oxides, nitrides, or silicides thereof; and
an adhesion-promoting material layer overlying and adhered to the resistive metal layer, the adhesion-promoting material providing enhanced adhesion between the resistive metal layer and a laminating material, wherein when a laminate is formed by laminating the resistive metal layer to the laminating material, the laminate has a peel strength of at least 2.5 lb/in.

23. The metal body of claim 22, wherein the peel strength is at least 2.9 lb/in.

24. The metal body of claim 22, wherein the adhesion promoting material increases the peel strength by at least 1.3 lb/in compared to the peel strength when the resistive foil is laminated to the laminating material in the absence of the adhesion-promoting material.

25. The metal body of claim 22, further comprising a stabilization layer between the metal foil layer and the resistive metal layer.

26. The metal body of claim 22, wherein the adhesion promoting material is at least one organosilane or organofunctional silane.

27. The metal body of claim 26 wherein the silane is a compound represented by the formula $$SiX_4$$

wherein X is a hydrolyzable group.

28. The metal body of claim 22, wherein the resistive metal is vapor deposited or sputter deposited.

29. The metal body of claim 22, wherein the metal foil is a copper foil or a copper alloy foil.

30. The metal body of claim 22, wherein the metal foil has not been roughened prior to application of the resistive metal layer.

31. A resistor assembly in a printed circuit board having conductive traces or pads interconnected by a resistive metal, comprising a metal body according to claim 22.

32. A laminate comprising:

a metal foil layer;

a resistive metal layer overlying the metal foil layer, wherein the resistive metal is selected from the group consisting of: NiCr, NiCrAlSi, aluminum, nickel, zinc, titanium, vanadium, manganese, iron, tantalum, molybdenum, ruthenium, and alloys, oxides, nitride or silicides thereof; and an adhesion-promoting material layer overlying and adhered to the resistive metal layer; and a layer of an electrically non-conductive material overlying and adhered to the adhesion-promoting layer, the adhesion-promoting material providing enhanced adhesion between the resistive metal layer and the laminating material, wherein a laminate has a peel strength of at least 2.5 lb/in.

33. The laminate of claim 32, wherein the peel strength is at least 2.9 lb/in.

34. The laminate of claim 32, wherein the adhesion promoting material increases the peel strength by at least 1.3 lb/in compared to the peel strength when the resistive foil is laminated to the laminating material in the absence of the adhesion-promoting material.

35. The laminate of claim 32, further comprising a stabilization layer between the metal foil layer and the resistive metal layer.

36. The laminate of claim 32, wherein in the absence of the adhesion-promoting material, the peel strength is substantially less than 2.9 lb/in.

37. The laminate of claim 32, wherein the adhesion promoting material is at least one organosilane or organofunctional silane.

38. The laminate of claim 37 wherein the silane is a compound represented by the formula $$SiX_4$$

wherein X is a hydrolyzable group.

39. The laminate of claim 32, wherein the metal foil has not been roughened prior to application of the resistive metal layer.

40. A resistor assembly in a printed circuit board having conductive traces or pads interconnected by a resistive metal, comprising the laminate of claim 32.

* * * * *